United States Patent
Oh et al.

(10) Patent No.: US 7,132,381 B1
(45) Date of Patent: Nov. 7, 2006

(54) PROCESS OF PREPARING LOW-TEMPERATURE SINTERED MICROWAVE DIELECTRIC CERAMICS

(75) Inventors: Young Jei Oh, Seoul (KR); Oleg A. Shlyakhtin, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 11/322,876

(22) Filed: Dec. 29, 2005

(30) Foreign Application Priority Data

Aug. 16, 2005  (KR) ...................... 10-2005-0074709
Dec. 1, 2005  (KR) ...................... 10-2005-0116233

(51) Int. Cl.
*C04B 35/495* (2006.01)
*C04B 35/453* (2006.01)

(52) U.S. Cl. ..................................... 501/134
(58) Field of Classification Search ................. 501/134
See application file for complete search history.

(56) References Cited

U.S. PATENT DOCUMENTS

| | | | | |
|---|---|---|---|---|
| 4,543,341 A | * | 9/1985 | Barringer et al. | 501/1 |
| 5,350,639 A | * | 9/1994 | Inoue et al. | 428/633 |
| 6,395,663 B1 | * | 5/2002 | Chen et al. | 501/134 |
| 6,730,623 B1 | * | 5/2004 | Dai | 501/134 |

FOREIGN PATENT DOCUMENTS

| | | | |
|---|---|---|---|
| JP | 05074225 A | * | 3/1993 |
| JP | 07172916 A | * | 7/1995 |

OTHER PUBLICATIONS

Lee et al, "Bi-ZN-NB-O microwave dielectric materials for mutlilayer filter application", Materials Chemistry and Physics, 79 (2003) pp. 124-128. no month available☐☐.*

* cited by examiner

*Primary Examiner*—David M. Brunsman
(74) *Attorney, Agent, or Firm*—Jones Day (57) ABSTRACT

There is provided a process of preparing low-temperature sintered microwave dielectric ceramics, prepared by a process comprising co-precipitating Nb and Bi or Zn in an aqueous basic solution to obtain a $BiNbO_4$ or $Zn_3Nb_2O_8$ precursor powder, thermally decomposing the powder to obtain $BiNbO_4$ or $Zn_3Nb_2O_8$ powder, adding CuO and $V_2O_5$, pulverizing and sintering the mixture, which produces ceramics having small dielectric losses ($Q \cdot f_0 > 15{,}000$ GHz) and high dielectric constant (k=20–45) at microwave frequencies by sintering at a low temperature of 700 to 750° C. Thus, the microwave dielectric ceramics prepared in accordance with the present invention can be advantageously used in multi-layer ceramic packaging such as filter planar antenna, microwave oscillator, etc., which comprise base metals such as silver (Ag) and copper (Cu) as an internal electrode.

10 Claims, 10 Drawing Sheets

PROCESS OF PREPARING LOW-TEMPERATURE SINTERED MICROWAVE DIELECTRIC CERAMICS

FIELD OF THE INVENTION

The present invention relates to a process of preparing microwave dielectric ceramics having a low sintering temperature of 700 to 750° C. and high dielectric properties. The dielectric ceramics of the present invention can be advantageously used with microwave chips or devices, which comprise a base metal such as silver (Ag) or copper (Cu) as an internal electrode.

BACKGROUND OF THE INVENTION

Recently, new dielectric materials have attracted immense attention since they can be used to fabricate multi-layer microwave chips and devices. Dielectric materials should have a sintering temperature lower than the melting point ($T_m$=940° C.) of internal electrodes formed of metals such as Ag for their application in, for example, chips having internal Ag contacts, together with minimum dielectric losses.

Currently, low temperature co-fired ceramics (LTCC) have been prepared by firing a mixture of conventional dielectric materials having a sintering temperature $T_s$>1100° C., and considerable amounts of glass frits or the components thereof. However, reducing the sintering temperature of such materials to about 900° C. is usually accompanied by rather high dielectric losses (low Q value, Q=1/tan δ) at microwave frequencies.

For example, U.S. Pat. No. 5,759,935 discloses that dense microwave dielectric ceramics can be prepared by mixing 10% of glass frit, which is obtained from a glass composition comprising PbO, $SiO_2$, $B_2O_3$ and ZnO, with a Zn- or Ta-doped BaO-x$TiO_2$ composition (3≦x≦5.5), and then sintering the mixture at a temperature of about 900° C. for 2 hours in air. However, the Q·$f_0$ values of such materials thus obtained do not exceed 2,500–3,500 GHz.

Another LTCC development is based on the introduction of small amounts (e.g., 0.1–5%) of dopant into the conventional microwave dielectric compound having a sintering temperature of about 1100 to 1300° C. This method allows the sintering temperature to be lowered by 200–300° C. by selecting suitable dopants. However, it has a problem in that a significant increase of dielectric loss will also result, even when using small amounts of dopant.

Alternative LTCC materials such as $CaTeO_3$ and $Bi_6Te_2O_{15}$ have been developed (see M. Valant et al., J. Eur. Ceram. Soc., 24 (2004), pp. 1715–1719; M. Udovic et al., J. Am. Ceram. Soc., 87 (2004), pp. 891–897). Such dielectric ceramics can be sintered at 900° C. or less without sintering aids or glass frits. However, they are disfavored since they contain toxic and volatile tellurium oxide.

Further, one of the conventional ways of reducing the sintering temperature of dielectric materials is to employ finely dispersed precursor powders obtained by the wet chemical methods (see Li-Wen Chu et al., Mater. Chem. Phys., 79, 2003, pp. 276 –281; M. H. Weng et al., J. Eur. Ceram. Soc., 22, 2002, pp. 1693–1698). Such methods can be successfully applied for producing microwave dielectrics having high Q·$f_0$ values (100,000–500,000 GHz). These materials, however, can be obtained only at a high sintering temperature (1,400–1,700° C.) due to the refractory components therein. The sintering temperature can be reduced by about 100–300° C. by using chemically derived precursors. Such chemically derived precursors have high chemical homogeneity and lead to significant grain-growth during the sintering process, thereby resulting in decrease of dielectric losses caused by insufficient crystallographic ordering and defects at the grain boundaries. However, the application of chemically derived precursors to LTCC ($T_s$<900° C.) dielectrics is hampered by enhanced energy dissipation at the grain boundaries. In most cases, the conventional method using a chemically derived precursor would produce dielectric ceramics having moderate or low Q·$f_0$ values (see H. Wang et al., Solid State Comm., 132(7), 2004, pp. 481–486).

In addition, $Zn_3Nb_2O_8$ ceramics, which have Q·$f_0$ values up to 80,000 GHz at $\epsilon_r$=22–23, have been developed. In this case, the sintering temperature of the ceramics can be reduced to 850° C. by using a sintering aid which melts at a low temperature (see Yen-Chi Lee et al., Mater. Chem. Phys., 79, 2003, pp. 124–128).

Further, $BiNbO_4$ is another candidate for a low-temperature sintered dielectric material. For example, Japanese Patent Nos. 07172916 and 05074225 disclose that the sintering temperature can be reduced to 875° C. through using suitable sintering aids.

However, those methods prepare the Nb-based ceramics through using coarsely grained precursor-powders obtained by using a solid-state synthesis technique, which has a limitation in applying for the preparation of low-temperature sintered dielectric ceramics. This is because the solid-state synthesis technique forms a precursor-powder in rather large grain sizes (e.g., usually several microns) so as to prevent the mobility thereof at a low sintering temperature, thus causing poor sinterability.

SUMMARY OF THE INVENTION

It is a primary object of the present invention to provide solutions to the aforementioned problems in the art and provide a method of preparing dielectric ceramics for microwave frequency that has a low sintering temperature of 700 to 750° C. as well as high dielectric properties.

It is another object of the present invention to provide low-temperature sintered microwave dielectric ceramics prepared in accordance with said method.

In accordance with one aspect of the present invention, there is provided a process for preparing low-temperature sintered microwave dielectric ceramics, which comprises the following steps: (i) co-precipitating Nb and Bi or Zn from an aqueous basic solution to obtain a $BiNbO_4$— or $Zn_3Nb_2O_8$-precursor powder; (ii) subjecting the precursor powder to a thermal decomposition to obtain a $BiNbO_4$— or $Zn_3Nb_2O_8$-powder; and (iii) adding CuO and $V_2O_5$ to the powder obtained in (ii) in amounts ranging from 0.1 to 1 wt % and 0.2 to 2 wt %, respectively, based on the total weight of the mixture, and then pulverizing and sintering the resulting mixture.

In accordance with another aspect of the present invention, there is provided a Ni-based dielectric ceramic having the composition of formula (I), which is prepared according to said method, and a sintering temperature of 700 to 750° C.

$$a\{x(A)+yNb_2O_5\}+bCuO+cV_2O_5 \qquad (I)$$

wherein, (A) is $Bi_2O_3$ or ZnO;

a is wt % ratio and 97≦a≦99.7;

b is wt % ratio and 0.1≦b≦1;

c is wt % ratio and 0.2≦c≦2;

x is wt % ratio, and $30 \leq x \leq 40$ when (A) is $Bi_2O_3$ and $42 \leq x \leq 52$ when (A) is ZnO; and y is wt % ratio, and $60 \leq y \leq 70$ when (A) is $Bi_2O_3$ and $48 \leq y \leq 58$ when (A) is ZnO.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PRESENT INVENTION

The method of the present invention is characterized in that the precursor powders of complex metal oxide such as $BiNbO_4$ and $Zn_3Nb_2O_8$ are obtained using the co-precipitation technique, followed by adding optimum amounts of CuO and $V_2O_5$ as sintering aids thereto, pulverizing and sintering the resulting mixture to prepare Nb-based microwave dielectric ceramics having a low sintering temperature of 700 to 750° C.

The microwave dielectric ceramics having the composition of formula (I) prepared in accordance with the present invention exhibit proper dielectric properties (e.g., k up to 45 and Q·$f_0$ value up to 35,000 GHz) at a much lower sintering temperature of 700 to 750° C., which is not achievable in the conventional method.

The present invention is described below in detail.

The method of the present invention not only adopts a solution process such as co-precipitation techniques for obtaining precursor powders having an improved sinterability, but also employs 0.1–1 wt. % of CuO and 0.2–2 wt. % of $V_2O_5$ as sintering aids in subsequent sintering step of the precursors. The co-precipitation technique, which is used in the present invention, produces finely grained powders with a minimum agglomeration degree to ensure high mobility of grains at a reduced sintering temperature.

The use of particular sintering aids in optimum amounts together with the precursor powders obtained by the co-precipitation techniques as described above allows the uniform grain-growth during the sintering process, thereby obtaining dense microwave dielectric ceramics having good dielectric properties at much lower temperatures.

The low-temperature sintered dielectric ceramics, which are prepared in accordance with the present invention, can minimize the interaction with internal metallic (e.g., Ag and Cu) contacts during the fabrication process of multi-layer dielectric chips and devices.

In the present invention, the microwave dielectric ceramics may be prepared by the method comprising the following steps: (i) co-precipitating Nb and Bi or Nb and Zn in a basic solution to obtain a $BiNbO_4$— or $Zn_3Nb_2O_8$-precursor powder; (ii) subjecting the precursor powders to a thermal decomposition to obtain a $BiNbO_4$— or $Zn_3Nb_2O_8$-powder; and (iii) adding 0.1 to 1 wt % of CuO and 0.2 to 2 wt % of $V_2O_5$ thereto, followed by pulverizing and sintering the mixture.

The suitable basic solution, which may be used as a precipitant in the present invention, include, but not limited to, 10–30% of aqueous solutions of ammonia ($NH_4OH$), ammonium carbonate (($NH_4)_2CO_3$), ammonium hydrocarbonate ($NH_4HCO_3$), butylamine or a mixture thereof.

The co-precipitation step (i) may be conducted by adding the mixture of $HNbCl_6$ and $Bi(NO_3)_3$ or $Zn(NO_3)_3$ drop-wise to the aqueous basic solution to form a precipitation. The most preferable aqueous basic solution, which is used as a precipitant in this step, is an ammonia/ammonium carbonate mixture when used for co-precipitation of Nb and Bi, and is n-butylamine for co-precipitation of Nb and Zn.

Alternatively, the co-precipitation step (i) may be performed by adding $HNbCl_6$ drop-wise to the aqueous basic solution, most preferably to the aqueous ammonia solution, to form Nb hydroxide, then dissolving the residue in an organic acid, followed by adding $Bi(NO_3)_3$ or $Zn(NO_3)_3$ thereto, and freezing the resulting solution by spraying it to liquid nitrogen. The most preferable organic acid is citric acid when $Bi(NO_3)_3$ is added, while oxalic acid is used when $Zn(NO_3)_3$ is added.

Further, $HNbCl_6$ and $Bi(NO_3)_3$ or $Zn(NO_3)_3$ may be mixed together at the stoichiometric ratio according to the compositions of the desired products (e.g., the Bi/Nb and Zn/Nb ratios of about 1/1 and 3/2, respectively).

$HNbCl_6$, which is used in the present invention, may be prepared by dissolving $NbCl_5$, e.g., in conc. HCl (the weight ratio of $NbCl_5$:HCl is about 1:1) and then diluting the solution with $H_2O$ to obtain 0.5–1M of $HNbCl_6$ solution. Also, $Bi(NO_3)_3$, which is used in the present invention, may be prepared by dissolving $Bi(NO_3)_3.5H_2O$ e.g., in about 12% $HNO_3$ and then diluting the solution with $H_2O$ to obtain 0.5–1M of $Bi(NO_3)_3$ solution. Further, $Zn(NO_3)_3$ may be prepared by dissolving $Zn(NO_3)_2.6H_2O$, e.g., in $H_2O$ to obtain 0.5–1M of $Zn(NO_3)_3$ solution.

It is preferred that the method of the present invention further comprises the step of freeze-drying the resulting powder obtained in step (i).

Further, the thermal decomposition step (ii) may be performed at a temperature of 600 to 800° C. for 1 to 4 hours. After the completion of the thermal decomposition, it is preferred that the resulting powders are further disaggregated by a milling process using a planetary ball mill having a ball/powder weight ratio of 10/1 to 20/1 without damaging their crystalline structure. In order to prevent the generation of defects and amorphization of powders during milling, the milling process may be preferably performed in a liquid medium such as ethyl alcohol.

Thereafter, 0.1 to 1 wt % of CuO and 0.2 to 2 wt % of $V_2O_5$ as sintering aids together with a binder may be added to the powder obtained in step (ii), followed by pulverizing and sintering the resulting mixture to obtain the ceramics according to the present invention. Further, the milling process as described above, if necessary, may be also performed after the addition of the sintering aids and a binder in step (iii). Representative examples of the binder include, but not limited to, poly(vinyl alcohol) (PVA), methylcellulose (MC), acrylic, polyvinyl butyral (PVB), polyethylene glycol (PEG).

The amounts of sintering aid may be optimized by taking into account both the sintering activity and microwave properties of the final product, dielectric ceramics. The best results for $BiNbO_4$ ceramics may be achieved when 0.2–0.5 wt. % of $V_2O_5$ and 0.1–0.5 wt. % of CuO are used, while for $Zn_3Nb_2O_8$ ceramics, 1–4 wt. % of $V_2O_5$ and 0.2–1 wt. % of CuO.

When the amount is less than the specified ranges, the desired effects for using a sintering aid cannot be obtained. However, when the amount is higher, the sintering property and microwave dielectric characteristics of the ceramics become lowered.

The method of the present invention allows the manufacture of dielectric ceramics having the composition of formula (I), which has small dielectric losses ($Q \cdot f_0 > 15{,}000$ GHz) and a high dielectric constant (k=20–45) at microwave frequencies at a low sintering temperature of 700 to 750° C.:

$$a\{x(A)+yNb_2O_5\}+bCuO+cV_2O_5 \qquad (I)$$

wherein,
(A) is $Bi_2O_3$ or ZnO;
a is wt % ratio and $97 \leq a \leq 99.7$;
b is wt % ratio and $0.1 \leq b \leq 1$;
c is wt % ratio and $0.2 \leq c \leq 2$;
x is wt % ratio, and $30 \leq x \leq 40$ when (A) is $Bi_2O_3$ and $42 \leq x \leq 52$ when (A) is ZnO; and
y is wt % ratio, and $60 \leq y \leq 70$ when (A) is $Bi_2O_3$ and $48 \leq y \leq 58$ when (A) is ZnO.

The microwave ceramics prepared in accordance with the present invention can be sintered at a low temperature of 700 to 750° C. They also have high quality factor (Q) and dielectric constant (k) together with a stable temperature coefficient of resonant frequency (TCF). Thus, it can be advantageously used in multi-layer ceramic packaging such as filter, planar antennal, microwave oscillator, etc.

The present invention is further described and illustrated in the Examples provided below. However, it should be expressly noted herein that the Examples are not intended to limit the scope of the present invention.

EXAMPLE 1

Preparation of Precursor Powders $NbCl_5$ was dissolved in conc.-HCl and then diluted with distilled water to obtain 1M of $HNbCl_6$ solution. $Bi(NO_3)_3 \cdot 5H_2O$ was dissolved in 12% $HNO_3$ and then diluted with distilled water to obtain 1M of $Bi(NO_3)_3$ solution. $Zn(NO_3)_2 \cdot 6H_2O$ was dissolved in distilled water to obtain 1M of $Zn(NO_3)_2$ solution. The $HNbCl_6$ and $Bi(NO_3)_3$ or $Zn(NO_3)_2$ solutions were mixed at the stoichiometric ratio according to the composition ratios of final products, i.e., Bi/Nb=1/1 and Zn/Nb=3/2, respectively. Each mixture solution was added drop-wise to each 12% aqueous solution of the following precipitant: $NH_4OH$, $(NH_4)_2CO_3$, $NH_4HCO_3$ and n-butylamine to form a precipitation. The resulting precipitate was separated from the residue by vacuum filtering, followed by washing until the absence of the $Cl^-$ ion was checked by the reaction with $AgNO_3$. The washed precipitate was frozen by cooling below 250 K to obtain the precursors of $BiNbO_4$ and $Zn_3Nb_2O_8$ in fine powders.

EXAMPLE 2

Preparation of Precursor Powders 1M of $HNbCl_6$, which is obtained as described in Example 1, was added drop-wise to 25% aqueous ammonia to form Nb hydroxide. The resulting precipitate was separated from the residue by vacuum filtering, followed by washing until the absence of the $Cl^-$ ion. The hydroxide was dissolved in 1M of citric acid at 40° C., and then 1M of $Bi(NO_3)_3$ was added thereto. Then, the resulting citrate solution was spray-frozen by spraying it to liquid nitrogen using a pneumatic nozzle while stirring. The liquid nitrogen was removed by evaporation to obtain the precursor of $BiNbO_4$ in a fine powder.

Also, the Nb-hydroxide, which is obtained as described above, was dissolved in 1M of oxalic acid at 40° C., and then 1M of $Zn(NO_3)_2$ was added thereto. The resulting oxalate solution was spray-frozen by spraying it to liquid nitrogen using a pneumatic nozzle while stirring. Then, the liquid nitrogen was removed by evaporation to obtain the precursor of $Zn_3Nb_2O_8$ in a fine powder.

The spray-frozen residue was freeze dried using a freeze drying machine at $5 \cdot 10^{-3}$ mBar with no external heat supply. The loss of snow-like dried product as a result of sudden vaporization was prevented by coating the drying trays with a non-woven fabric cover.

EXAMPLE 3

Preparation of $BiNbO_4$ or $Zn_3Nb_2O_8$ Powder

The precursor powders obtained in Examples 1 or 2 were subjected to thermal decomposition in a muffle furnace at a temperature of 600 to 800° C. in air to obtain $BiNbO_4$ and $Zn_3Nb_2O_8$ powders. A thermal process at a temperature of about 400 to 550° C. results in the completion of thermal decomposition, but the products thus obtained are in an amorphous form.

Figure 1:
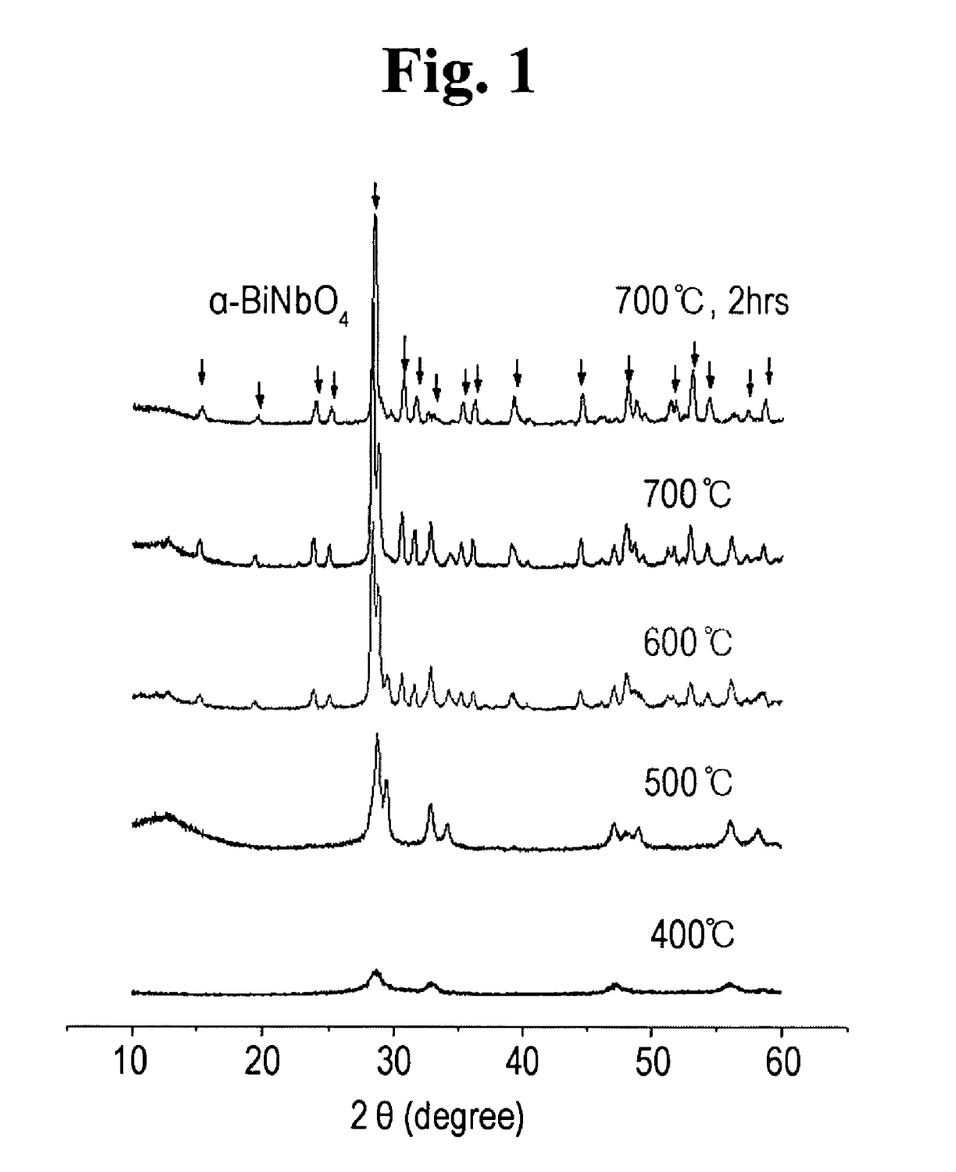
FIG. 1 is a graph showing XRD patterns of $BiNbO_4$-precuor powders according to the changes of thermal decomposition temperature.
Figure 2A:
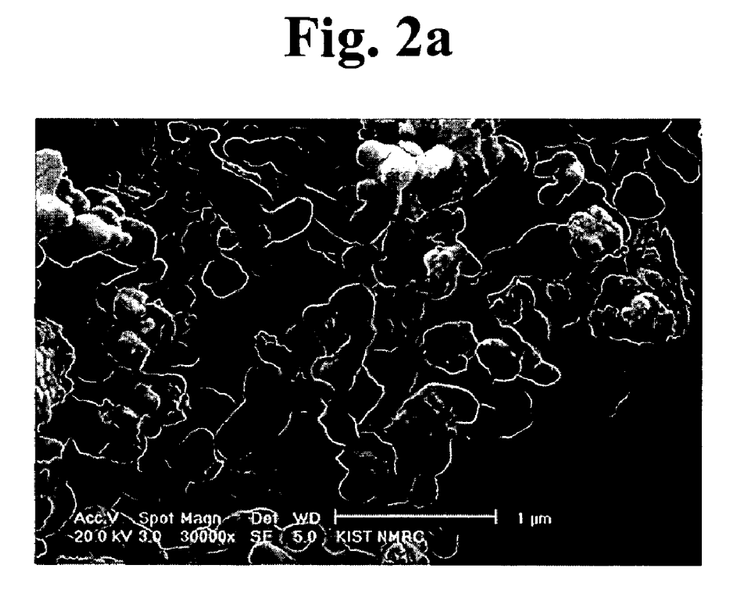
FIGS. 2a to 2d are scanning electron microscope (SEM) scans of the $BiNbO_4$-powders, which are prepared from the precursors obtained by precipitation using ammonia (2a), ammonium carbonate (2b) and n-butylamine (2d), and from spray-frozen citrate solution (2c), respectively.
Figure 2B:
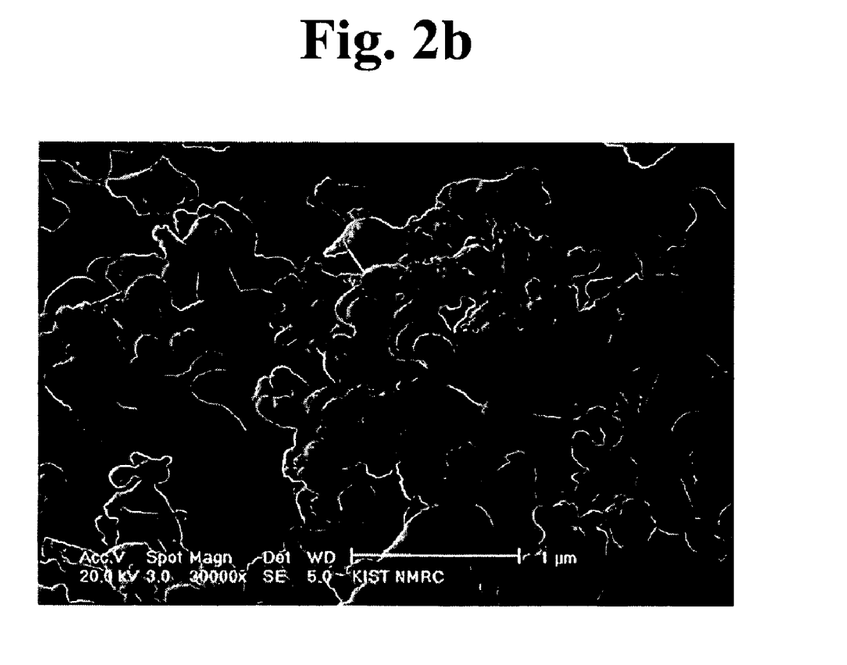
Figure 2C:
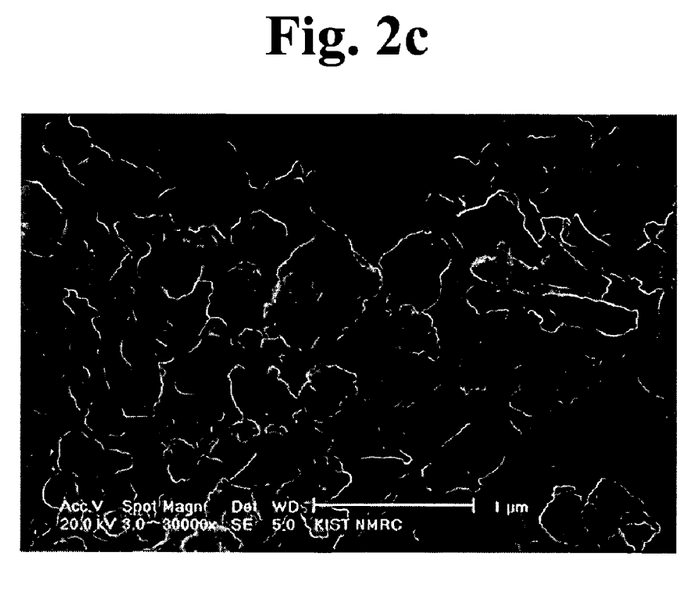
Figure 2D:
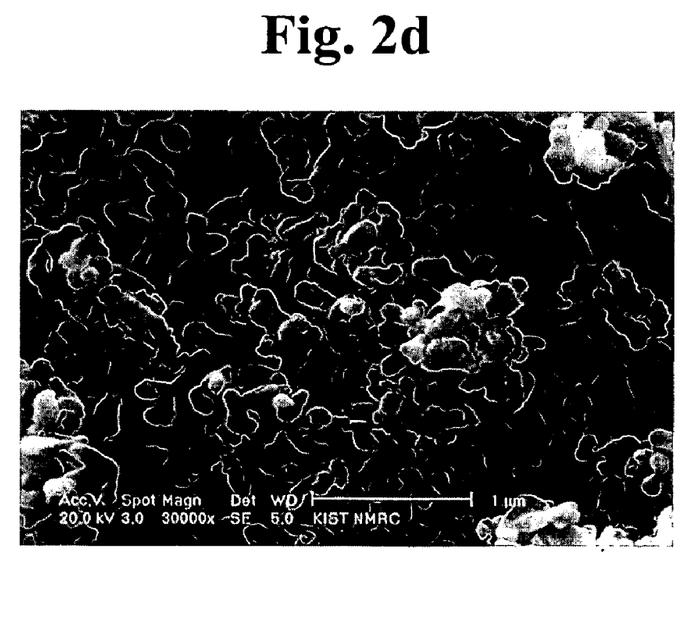

FIG. 1 shows XRD patterns of the $BiNbO_4$-precursor powders according to various thermal decomposition temperatures. As shown in FIG. 1, the thermal process at $T \geq 600°$ C. leads to the mixture of $BiNbO_4$ and various meta-stable binary oxides (e.g., $Bi_5Nb_3O_{15}$, $Bi_3Nb_{17}O_{47}$, $Bi_8Nb_{18}O_{57}$ and the like). At $T \geq 700°$ C., single phase $BiNbO_4$ is produced.

FIGS. 2a–2d are scanning electron microscope (SEM) scans of $BiNbO_4$-powders, which are produced at 700° C. by thermal decomposition of the precursor powders obtained by different methods. As shown in FIGS. 2a–2d, the size and shape of the $BiNbO_4$ crystallites vary depending on the kind of precursors used. Specifically, the particle size is the smallest when it is prepared from the precursors obtained by precipitation using n-butylamine (2d). It is largest when prepared from the precursors obtained from the spray-frozen citrate solution (2c). The particle sizes of the other two powders prepared from the precursors obtained from the precipitation using ammonia (2a) and ammonium carbonate (2b) are very similar.

Figure 3:
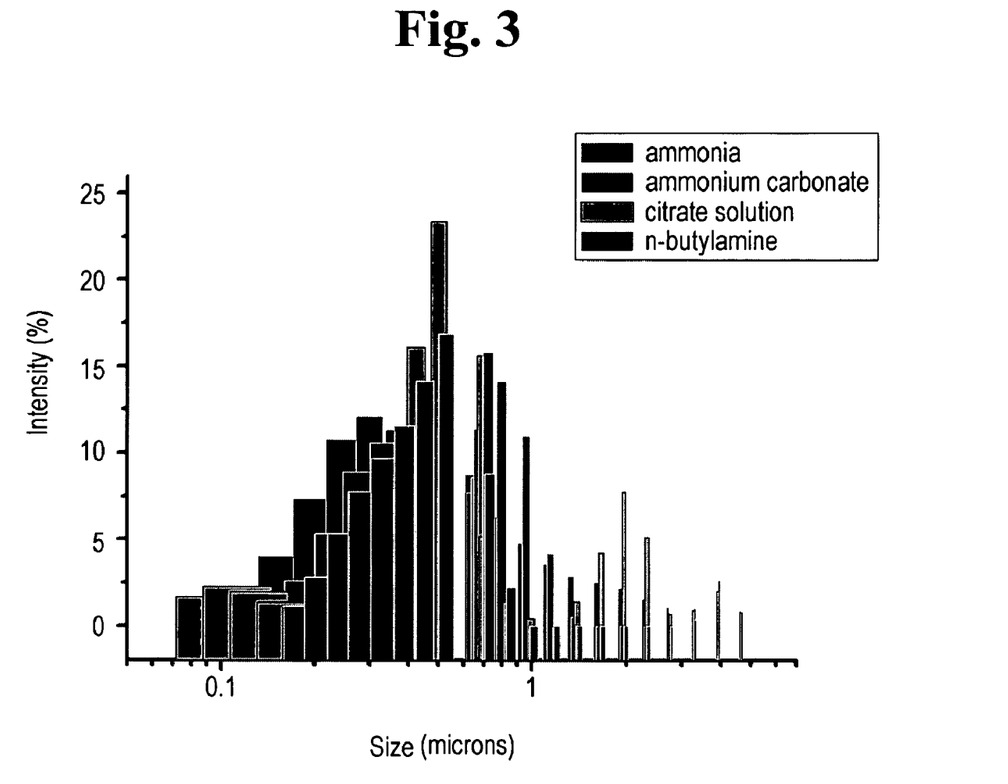
FIG. 3 is a graph showing particle (agglomerate) size distribution of the $BiNbO_4$-powders, which are prepared from the precursors obtained by precipitation using ammonia, ammonium carbonate and n-butylamine, and from spray-frozen citrate solution.

FIG. 3 is a graph showing the grain (agglomerate) size distribution of the BiNbO$_4$-powders using the conventional light scattering method, which are produced at 700° C. by thermal decomposition of precursor powders obtained by different methods. FIG. 3 demonstrates that the powders obtained according to the present invention are loosely agglomerated. Specifically, the agglomerate size of the powders, which are obtained from precursors (0.3–0.4 microns) obtained by different methods, is only slightly larger than the mean grain size by the above SEM analysis except the powder obtained using n-butylamine as a precipitant. When using n-butylamine as a precipitant, the size of crystallites is less than 100 nm while the mean agglomerate size is more than 500 nm.

Figure 4:
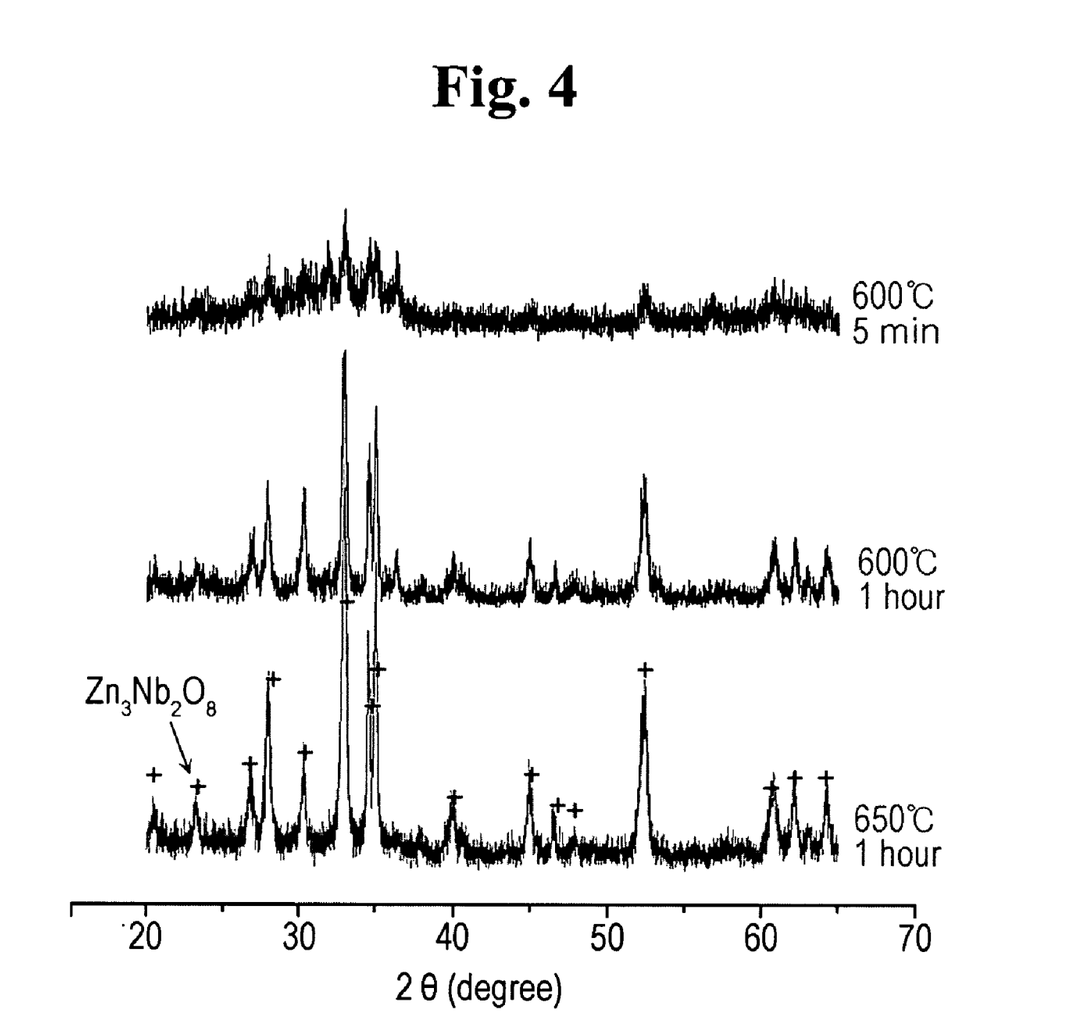
FIG. 4 is a graph showing XRD patterns of $Zn_3Nb_2O_8$-precuor powders according to the changes of thermal decomposition temperature.

FIG. 4 shows XRD patterns of Zn$_3$Nb$_2$O$_8$-precursor powders at various thermal decomposition temperatures. As shown in FIG. 4, the thermal process at a temperature of 600–700° C. leads to Zn$_3$Nb$_2$O$_8$ and ZnNb$_2$O$_6$ simultaneously. The ratio between these phases depends both on the kind of precursor used and the thermal process conditions. If the thermal decomposition process is performed under the same time and temperature conditions, the amount of Zn$_3$Nb$_2$O$_8$ is higher for precipitation-derived precursors, while isothermal annealing at 750–800° C. leads to the conversion of ZnNb$_2$O$_6$ to Zn$_3$Nb$_2$O$_8$. Particularly, the crystallization of the oxalate-derived precursors proceeds at a lower rate than that of the precipitation-derived precursors. The crystalline Zn—Nb oxides are formed at T>700° C.

Figure 5A:
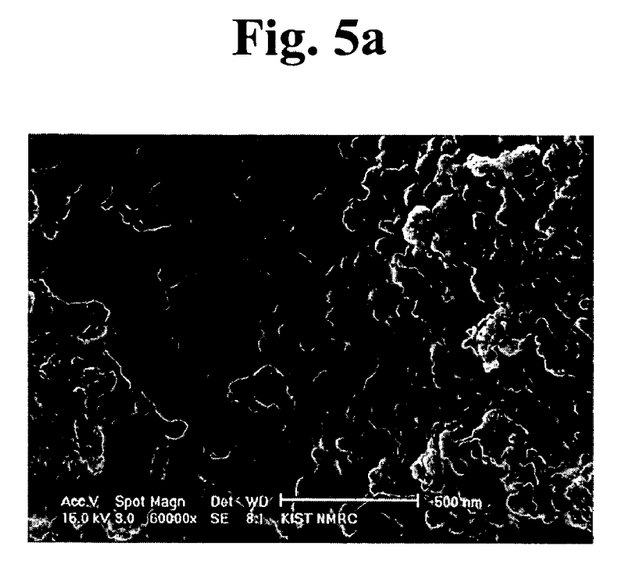
FIGS. 5a to 5d are scanning electron microscope (SEM) scans of the $Zn_3Nb_2O_8$-powders, which are obtained by thermal decomposition processes at 600° C. (5a), 650° C. (5b), 700° C. (5c) and 800° C. (5d), respectively.
Figure 5B:
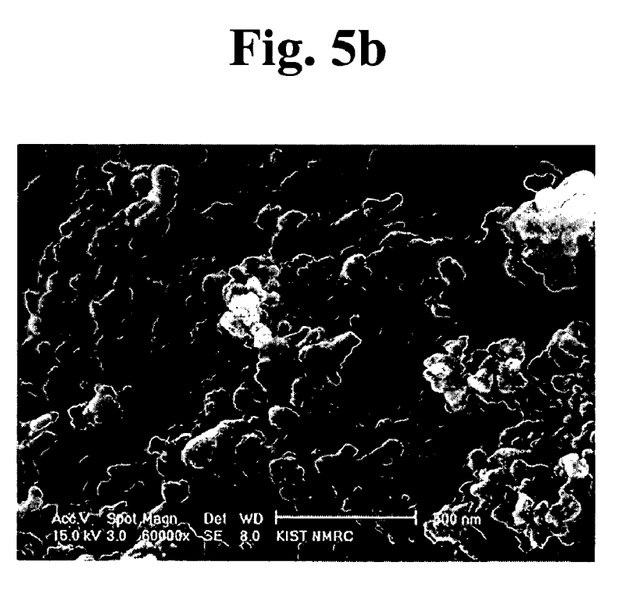
Figure 5C:
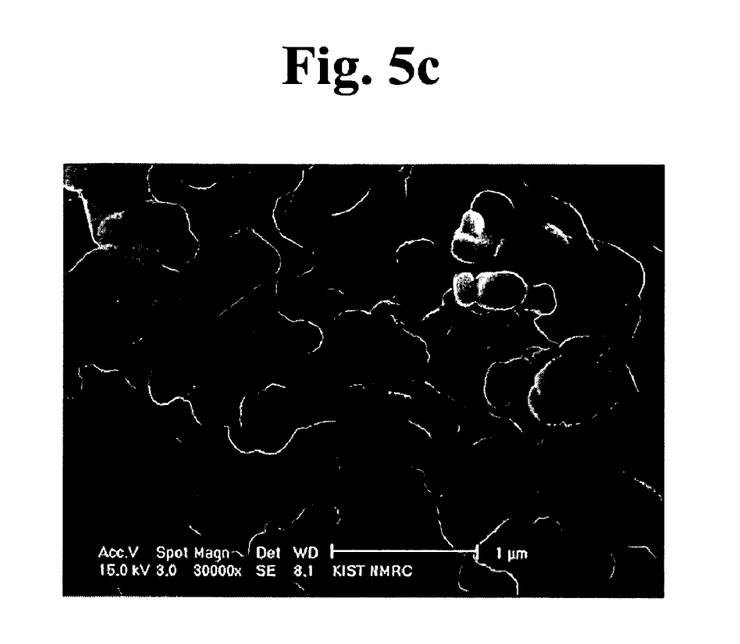
Figure 5D:
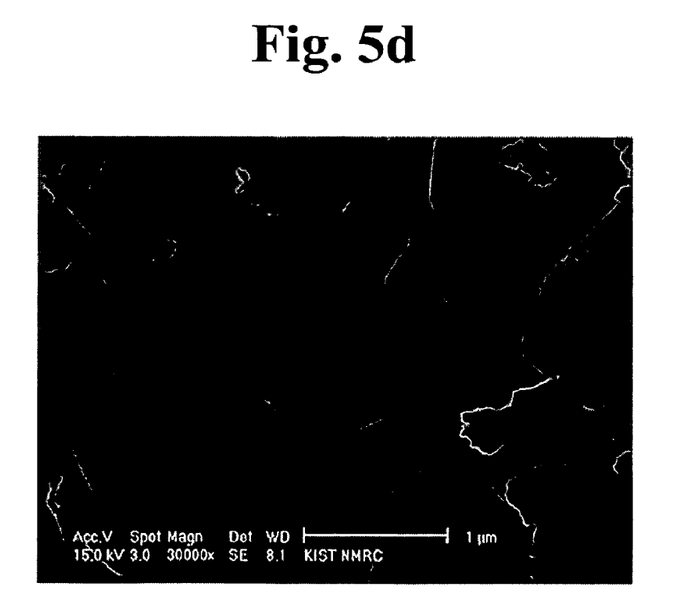

FIGS. 5a to 5d are scanning electron microscope (SEM) scans of the Zn$_3$Nb$_2$O$_8$-powders obtained by thermal decomposition of the precipitate-derived powders at temperatures of 600° C., 650° C., 700° C. and 800° C., respectively. As shown in FIGS. 5a–5d, thermal decomposition process at a temperature of 600–650° C., which is required for crystallization of Zn$_3$Nb$_2$O$_8$, leads to preservation of the initial nanocrystalline morphology of powders (FIGS. 5a and 5b). If the thermal decomposition temperature is increased to T≧700° C., then a relatively uniform grain-growth occurs (FIGS. 5c and 5d). The grain morphology and packing characteristics of Zn$_3$Nb$_2$O$_8$ are also influenced by its pre-chemical history. Specifically, particle coarsening in morphologically uniform and softly agglomerated precipitate-derived precursors proceeds through the re-agglomeration of primary nanoparticles having a size of about 50 nm into larger isotropic particles (FIGS. 5a–5c). The powder prehistory of spray-frozen oxalate precursor and a higher thermal decomposition temperature lead to a wide and multi-modal particle size distribution.

Figure 6:
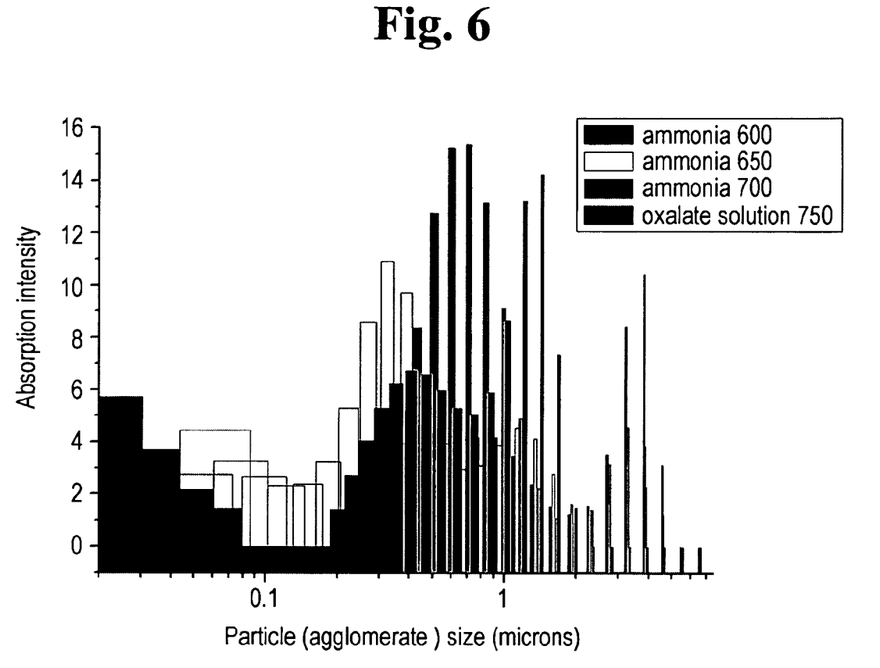
FIG. 6 is a graph showing particle (agglomerate) size distribution of the $Zn_3Nb_2O_8$-powders, which are prepared from the precursors obtained by precipitation using ammonia, ammonium carbonate and n-butylamine, and from spray-frozen oxalate solution.

In addition, the grain size measured by SEM analysis correlates quite well with the agglomerate size, which is analyzed using the light scattering methods (FIG. 6). Increase of the decomposition temperature results in shift of the maximum distribution to higher values, which means that the systematic enhancement of the strength of agglomerates occurs along with the growth of grain size. Relatively strong agglomerates are observed in Zn$_3$Nb$_2$O$_8$ powders even at a low thermal decomposition temperature of about 700° C., in case of using a precursor obtained from the spray-frozen oxalate solution. This is because the formation of strong agglomerates occurs at that temperature range in frozen aqueous solutions.

EXAMPLE 4

Preparation of BiNbO$_4$ or Zn$_3$Nb$_2$O$_8$ Dielectric Ceramics

The BiNbO$_4$ or Zn$_3$Nb$_2$O$_8$ powders obtained in Example 3 were subjected to a milling process using a planetary ball mill in ethyl alcohol medium without damaging its crystalline structure. The milling process was also performed for introducing sintering aids and 10% of aqueous solutions of PVA thereto.

The raw powders 1 and 2 were each uniaxially pressed into pellets having diameter to height ratios of about 0.3–0.4. The raw powder 1 was obtained by mixing the BiNbO$_4$ powders, which are obtained from the precipitation-precursor using an ammonia/ammonium carbonate mixture, and sintering aids so as to comprise 63.7 wt. % of Bi$_2$O$_3$, 36.3 wt % of Nb$_2$O$_5$, 0.5 wt % of V$_2$O$_5$ and 0.2 wt % of CuO. Further, the raw powder 2 was obtained by mixing the Zn$_3$Nb$_2$O$_8$ powders, which are obtained from the precipitation-precursor using n-butylamine, and sintering aids so as to comprise 47.0 wt % of ZnO, 53 wt % of Nb$_2$O$_5$, 2 wt % of V$_2$O$_5$ and 0.5 wt % of CuO.

Thereafter, each pellet was sintered for 10 min to 20 hours at a temperature of 700–850° C. with a heating rate of 5 K/min and then cooled to room temperature at a cooling rate of 3–4 K/min. After completing the sintering process, the surfaces of the sintered pellets were thoroughly polished using a sand paper, thereby obtaining the dielectric ceramics.

The density of the ceramics was measured by the conventional geometric method measuring the mean value of multipoint measurements in order to prevent overestimation of the density values. The results are shown in FIGS. 7 and 8.

Figure 7:
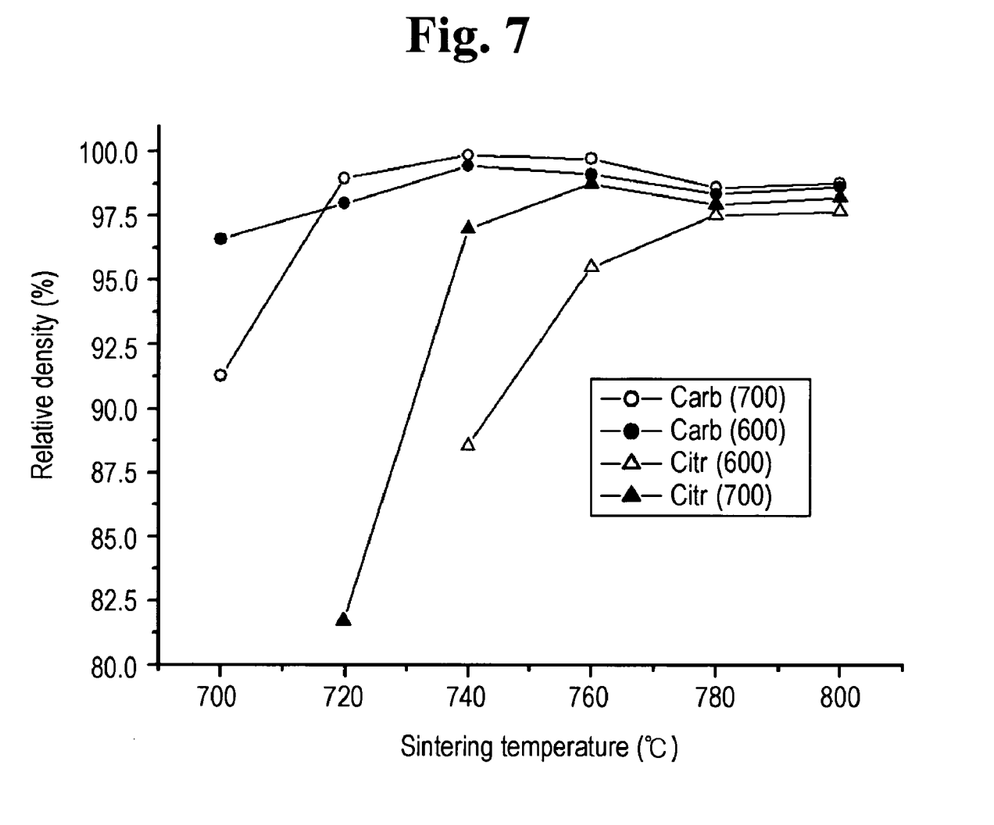
FIG. 7 is a graph showing relative densities of $BiNbO_4$ ceramics according to the changes of sintering temperature.

FIG. 7 is a graph showing the relationships between relative densities and sintering temperatures for BiNbO$_4$ ceramics prepared from the precursors, which are obtained by different processes. The term "Carb" used herein means the ceramics, which are prepared from the precursors obtained by precipitation using ammonium carbonate, while "Citr" means those from spray-frozen citrate solution; and "600" and "700" means the temperatures of the thermal decomposition of precursors.

As shown in FIG. 7, a high density of greater than 95% can be obtained at a temperature as low as about 700° C. according to the present invention, which is not achievable in the conventional method. Also, the sintering activity of BiNbO$_4$ powders is closely related with respect to both the kind of the precursor used and sintering temperature, as similar to their micro-morphology. Specifically, the BiNbO$_4$ powders obtained from the spray-frozen citrate solutions, which have a greater grain size and higher strength of primary agglomerates, exhibit poorer sinterability when compared to those from precipitate-derived precursors. Also, the powders obtained from different kinds of precursors may have opposite dependencies of sinterability on thermal decomposition temperature. If the thermal decomposition temperature is increased from 600 to 700° C., then the sintering activity of the powders obtained from precipitate-derived precursor decreases, and the sintering activity of the powders obtained from spray-frozen solution increases. Taking into account the fact that the single phase crystalline BiNbO$_4$ is formed at 600° C. for the powders obtained from the precipitate-derived precursors, and is formed at 700° C. from the spray-frozen solution-derived precursors, it is clear that the maximum sintering activity at a low temperature can be realized for single phased crystalline powders.

Figure 8:
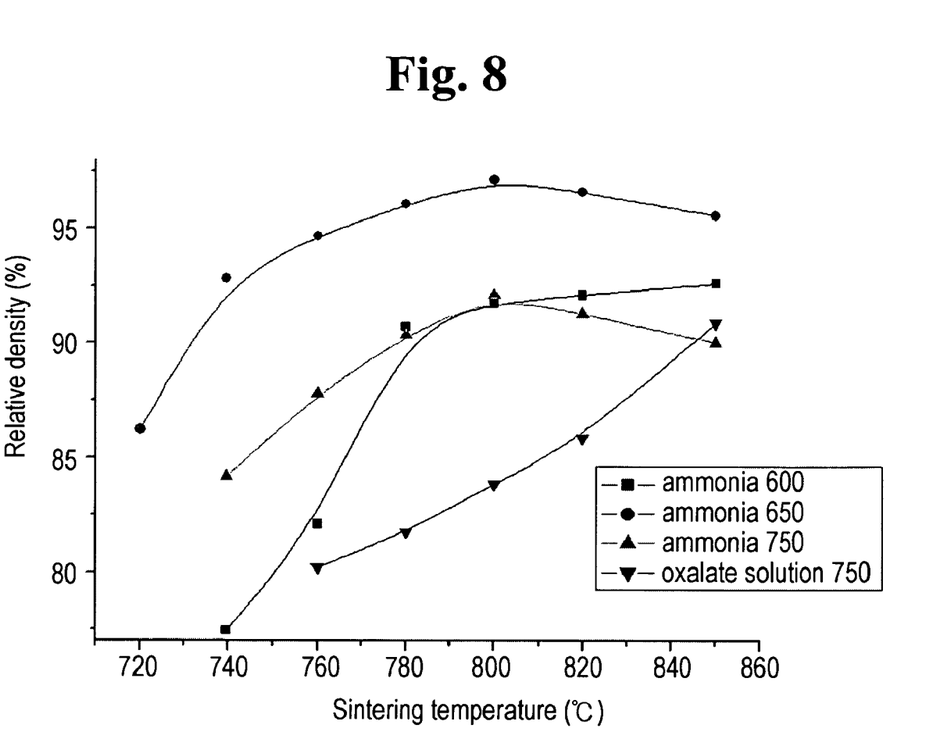
FIG. 8 is a graph showing relative densities of $Zn_3Nb_2O_8$ ceramics according to the changes of sintering temperature.

FIG. 8 demonstrates that Zn$_3$Nb$_2$O$_8$ powders also show the similar tendencies with the above BiNbO$_4$ powders. Specifically, the sintering activity of the powders obtained from a spray-frozen oxalate solution is much lower than those from precipitate-derived precursors, which correlates quite well with the fact that Zn$_3$Nb$_2$O$_8$ is crystallized at a higher temperature for the powders from a spray-frozen oxalate solution. Also, in spite of smaller grain size of $Zn_3Nb_2O_8$ powders obtained from precipitate-derived precursors at 600° C., the sintering activity thereof is lower than those obtained at 650° C., while the further increase of thermal decomposition temperature causes decrease of sinterability. This non-monotonous dependence of sintering activity on thermal decomposition temperature also stresses the ultimate effect of the phase purity and crystallinity to the low-temperature sinterability of fine powders. That is to say, the finely grained $Zn_3Nb_2O_8$ powders are still in the semi-amorphous state at 600° C., and annealing of crystalline $Zn_3Nb_2O_8$ powders at T>650° C. promotes grain-growth causing a decrease of sinterability.

Along with the high-density values, the dielectric materials prepared in accordance with the present invention has high dielectric properties at microwave frequencies at a low sintering temperature. The microwave properties of the dielectric materials were measured at room temperature by the modified Hakki-Coleman method, which is well known to those skilled in the art, at f=1–15 GHz.

The high frequency dielectric properties of $BiNbO_4$ ceramic obtained from the raw powder 1 are shown in Table 1.

TABLE 1

| Sintering temp. (° C.) | Relative density (%) | Frequency (GHz) | Dielectric constant (k) | Q · f$_0$(GHz) |
|---|---|---|---|---|
| 700 | 97 | 8.26 | 46.4 | 10,500 |
| 720 | 98 | 7.70 | 44.6 | 21,600 |
| 740 | 98 | 7.70 | 44.4 | 20,100 |
| 780 | 97 | 8.40 | 44.8 | 16,900 |

As shown in Table 1, the $BiNbO_4$-precursor powders prepared in accordance with the present invention exhibit high relative densities and relatively small dielectric losses (Q·f$_0$>10,000 GHz) at a low sintering temperature of 700° C. The increase of sintering temperature to 720° C. or higher, combined with acceleration of mass transfer by sintering aids, causes further enhancement of quality factor (Q·f$_0$) value to 20,000 GHz or higher. If the sintering temperature exceeds the optimum range, the quality factor of the dielectric materials prepared in accordance with the present invention decreases due to the exaggerated grain growth and de-densification, similarly to the LTCC ceramics obtained using the conventional solid sate synthesis technique. Also, dielectric constants thereof are high enough for practical applications and correlate quite well with corresponding values of $BiNbO_4$ ceramics obtained by the conventional method using a solid sate synthesis technique.

Further, the high frequency dielectric properties of $Zn_3Nb_2O_8$ ceramic obtained from the raw powder 2 are shown in Table 2.

TABLE 2

| Sintering temp. (° C.) | Relative density (%) | Frequency (GHz) | Dielectric constant (k) | Q · f$_0$(GHz) |
|---|---|---|---|---|
| 740 | 94 | 10.38 | 20.7 | 30,000 |
| 780 | 95 | 12.22 | 20.2 | 35,900 |
| 800 | 94 | 11.84 | 20.3 | 36,000 |
| 820 | 91 | 10.64 | 20.8 | 16,100 |

Low-temperature sintering processes occur in $Zn_3Nb_2O_8$ at a little higher temperature when compared to $BiNbO_4$ in view of FIGS. 7 and 8. Thus, the density values greater than 92–93%, which are usually demanded for microwave dielectric materials, can be achieved at about T≧740°. This is compensated by higher quality factor values and intensity of grain growth in $Zn_3Nb_2O_8$. As shown in Table 2, the $Zn_3Nb_2O_8$ ceramic prepared in accordance with the present invention shows further decrease of dielectric losses to 30,000–35,000 GHz. If the sintering temperature exceeds the optimum range, the quality factor decreases due to the exaggerated grain growth and de-densification, similarly to the $BiNbO_4$ ceramics. Also, dielectric constants thereof are high enough for practical applications and correlate quite well with corresponding values of $Zn_3Nb_2O_8$ ceramics obtained by the conventional method using a solid sate synthesis technique.

While the present invention has been described with respect to the above specific embodiments, it should be recognized that various modifications and changes may be made to the present invention by those skilled in the art which also fall within the scope of the invention as defined by the appended claims.

What is claimed is:

1. A process for preparing low-temperature sintered microwave dielectric ceramics, comprising:
   (a) co-precipitating Nb and Bi or Zn in an aqueous basic solution to obtain a $BiNbO_4$— or $Zn_3Nb_2O_8$-precursor powder;
   (b) subjecting the precursor powder to a thermal decomposition to obtain a $BiNbO_4$— or $Zn_3Nb_2O_8$-powder;
   (c) adding CuO and $V_2O_5$ to the powder obtained in (ii) in amounts ranging from 0.1 to 1% by weight and 0.2 to 2% by weight based on the mixture, respectively; and
   (d) pulverizing and sintering the mixture.

2. The process of claim 1, wherein the aqueous basic solution comprises a base precipitant selected from the group consisting of ammonia, ammonium carbonate, ammonium hydrocarbonate, butylamine and mixtures thereof.

3. The process of claim 1, wherein the co-precipitation step (a) is conducted by adding a mixture of $HNbCl_6$ and $Bi(NO_3)_3$ or $Zn(NO_3)_3$ drop-wise to the aqueous basic solution.

4. The process of claim 3, wherein the aqueous basic solution comprises n-butylamine or an ammonia/ammonium carbonate mixture.

5. The process of claim 1, wherein the co-precipitation step (a) comprises:
   (i) adding $HNbCl_6$ drop-wise to the aqueous basic solution to form Nb-hydroxide;
   (ii) dissolving the hydroxide in an organic acid and adding $Bi(NO_3)_3$ or $Zn(NO_3)_3$ thereto; and
   (iii) freezing a resulting solution by spraying to liquid nitrogen.

6. The process of claim 5, wherein the aqueous basic solution is an aqueous ammonia solution, and wherein the organic acid is citric acid when $Bi(NO_3)_3$ is added, and wherein the organic acid is oxalic acid when $Zn(NO_3)_3$ is added.

7. The process of claim 1, further comprising the step of freeze-drying the precursor powders obtained in co-precipitation step (a).

8. The process of claim 1, wherein the thermal decomposition step (b) is conducted at a temperature of 600 to 800° C. for 1 to 4 hours.

9. The process of claim 1, further comprising the step of disaggregating the powders obtained in step (b) by using a milling.

10. A microwave dielectric ceramic having the composition of formula (I) prepared according to any one of claims 1 to 9, wherein the ceramic has a sintering temperature of 700 to 750° C.

$$a\{x(A)+y\mathrm{Nb}_2\mathrm{O}_5\}+b\mathrm{CuO}+c\mathrm{V}_2\mathrm{O}_5 \qquad (I)$$

wherein,
(A) is $\mathrm{Bi}_2\mathrm{O}_3$ or ZnO;
a is wt % ratio and $97 \leq a \leq 99.7$;
b is wt % ratio and $0.1 \leq b \leq 1$;
c is wt % ratio and $0.2 \leq c \leq 2$;
x is wt % ratio, and $30 \leq x \leq 40$ when (A) is $\mathrm{Bi}_2\mathrm{O}_3$ and $42 \leq x \leq 52$ when
(A) is ZnO; and
y is wt % ratio, and $60 \leq y \leq 70$ when (A) is $\mathrm{Bi}_2\mathrm{O}_3$ and $48 \leq y \leq 58$ when
(A) is ZnO.

* * * * *